United States Patent
Chen et al.

(10) Patent No.: US 12,500,192 B2
(45) Date of Patent: *Dec. 16, 2025

(54) PACKAGE AND MANUFACTURING METHOD THEREOF

(71) Applicant: Taiwan Semiconductor Manufacturing Company, Ltd., Hsinchu (TW)

(72) Inventors: Ming-Fa Chen, Taichung (TW); Hsien-Wei Chen, Hsinchu (TW); Sung-Feng Yeh, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 686 days.

This patent is subject to a terminal disclaimer.

(21) Appl. No.: 17/853,960

(22) Filed: Jun. 30, 2022

(65) Prior Publication Data

US 2022/0336395 A1    Oct. 20, 2022

Related U.S. Application Data

(63) Continuation of application No. 16/547,596, filed on Aug. 22, 2019, now Pat. No. 11,417,619.

(51) Int. Cl.
*H01L 23/00* (2006.01)
*H01L 21/56* (2006.01)
(Continued)

(52) U.S. Cl.
CPC ............ *H01L 24/08* (2013.01); *H01L 21/561* (2013.01); *H01L 21/565* (2013.01);
(Continued)

(58) Field of Classification Search
CPC .......................... H01L 24/08; H01L 25/0657
See application file for complete search history.

(56) References Cited

U.S. PATENT DOCUMENTS 8,580,683 B2 * 11/2013 Wang ............... H01L 25/0655
   257/782
9,947,626 B2 * 4/2018 Chen ............... H01L 23/49827
(Continued)

FOREIGN PATENT DOCUMENTS

| CN | 102347320 | 2/2012 |
| CN | 103137583 | 6/2013 |
| CN | 109427597 | 3/2019 |

OTHER PUBLICATIONS

"Notice of allowance of China Counterpart Application", issued on Feb. 8, 2025, p. 1-p. 4.

*Primary Examiner* — Ali Naraghi
(74) *Attorney, Agent, or Firm* — JCIPRNET

(57) ABSTRACT

A package includes a first die, a second die, an encapsulant, and through insulating vias (TIV). The first die has a first bonding structure. The first bonding structure includes a first dielectric layer and first connectors embedded in the first dielectric layer. The second die has a semiconductor substrate and a second bonding structure over the semiconductor substrate. The second bonding structure includes a second dielectric layer and second connectors embedded in the second dielectric layer. Sidewalls of the second dielectric layer are aligned with sidewalls of the semiconductor substrate. The first bonding structure is in physical contact with the second bonding structure such that the first dielectric layer is bonded to the second dielectric layer and the first connectors are bonded to the second connectors. The encapsulant laterally encapsulates the second die. The TIVs are aside the second die and are connected to the first bonding structure.

20 Claims, 14 Drawing Sheets

(51) Int. Cl.
  *H01L 21/768* (2006.01)
  *H01L 21/78* (2006.01)
  *H01L 23/31* (2006.01)
  *H01L 23/48* (2006.01)
  *H01L 23/528* (2006.01)
  *H01L 25/00* (2006.01)
  *H01L 25/065* (2023.01)

(52) U.S. Cl.
  CPC ........ *H01L 21/76885* (2013.01); *H01L 21/78* (2013.01); *H01L 23/3107* (2013.01); *H01L 23/481* (2013.01); *H01L 23/528* (2013.01); *H01L 24/03* (2013.01); *H01L 24/05* (2013.01); *H01L 24/13* (2013.01); *H01L 24/89* (2013.01); *H01L 25/0657* (2013.01); *H01L 25/50* (2013.01); *H01L 2224/0401* (2013.01); *H01L 2224/05024* (2013.01); *H01L 2224/05541* (2013.01); *H01L 2224/0557* (2013.01); *H01L 2224/08147* (2013.01); *H01L 2224/13023* (2013.01); *H01L 2224/80013* (2013.01); *H01L 2224/80895* (2013.01); *H01L 2224/80896* (2013.01); *H01L 2225/06541* (2013.01); *H01L 2225/06548* (2013.01); *H01L 2225/06568* (2013.01); *H01L 2225/06586* (2013.01); *H01L 2924/20105* (2013.01); *H01L 2924/20106* (2013.01); *H01L 2924/20107* (2013.01); *H01L 2924/20108* (2013.01); *H01L 2924/20109* (2013.01); *H01L 2924/2011* (2013.01)

(56) References Cited

U.S. PATENT DOCUMENTS

| | | | |
|---|---|---|---|
| 11,417,619 B2 * | 8/2022 | Chen | H01L 21/561 |
| 2014/0103488 A1 * | 4/2014 | Chen | H01L 24/19 |
| | | | 257/532 |
| 2017/0271306 A1 * | 9/2017 | Wang | H01L 23/3142 |
| 2019/0067104 A1 * | 2/2019 | Huang | H01L 24/16 |

* cited by examiner

PACKAGE AND MANUFACTURING METHOD THEREOF

CROSS-REFERENCE TO RELATED APPLICATION

This is a continuation application of and claims the priority benefit of U.S. application Ser. No. 16/547,596, filed on Aug. 22, 2019, now allowed. The entirety of the above-mentioned patent application is hereby incorporated by reference herein and made a part of this specification.

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for the wafer level packaging. Integration of multiple semiconductor devices have become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
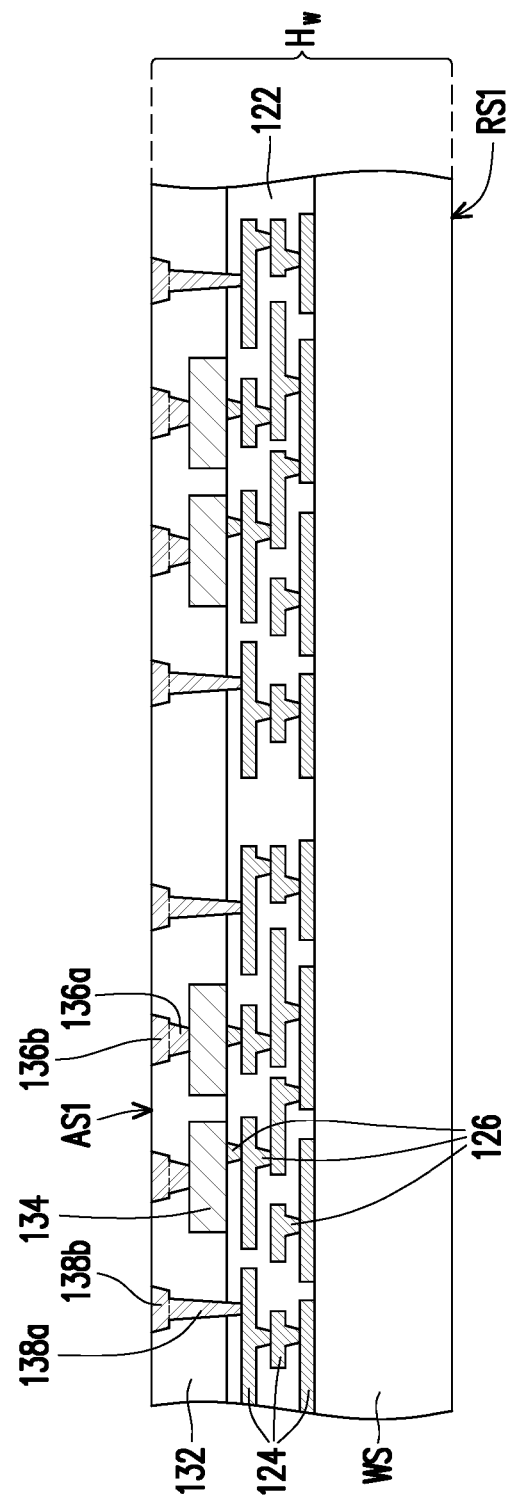
FIG. 1A to FIG. 1K are schematic cross-sectional views illustrating a manufacturing process of a package in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1K are schematic cross-sectional views illustrating a manufacturing process of a package in accordance with some embodiments of the disclosure. Referring to FIG. 1A, a semiconductor wafer W is provided. In some embodiments, the semiconductor wafer W includes a wafer substrate WS and a first interconnection structure 120 formed on the semiconductor wafer W. In some embodiments, the semiconductor wafer W has a first bonding structure 130 formed thereon, and the first bonding structure 130 is also considered as part of the semiconductor wafer W.

In some embodiments, the wafer substrate WS may be made of a suitable elemental semiconductor, such as crystalline silicon, diamond, or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the wafer substrate WS may include active components (e.g., transistors or the like) and/or passive components (e.g., resistors, capacitors, inductors, or the like) formed therein. In some embodiments, the wafer substrate WS may further include a plurality of through semiconductor vias (TSV) penetrating through the wafer substrate WS for dual-side connection. However, the TSVs may be optional in the wafer substrate WS, so these TSVs are not shown in FIG. 1A.

As illustrated in FIG. 1A, the first interconnection structure 120 is disposed on the wafer substrate WS. In some embodiments, the first interconnection structure 120 includes a first inter-dielectric layer 122, a plurality of first patterned conductive layers 124, and a plurality of first conductive vias 126. In some embodiments, the first patterned conductive layers 124 and the first conductive vias 126 are embedded in the first inter-dielectric layer 122. For simplicity, the first inter-dielectric layer 122 is illustrated as a bulky layer in FIG. 1A, but it should be understood that the first inter-dielectric layer 122 may be constituted by multiple dielectric layers. The first patterned conductive layers 124 and the dielectric layers of the first inter-dielectric layer 122 are stacked alternately. In some embodiments, two adjacent first patterned conductive layers 124 are electrically connected to each other through the conductive vias 126 sandwiched therebetween.

In some embodiments, a material of the first inter-dielectric layer 122 includes polyimide, epoxy resin, acrylic resin, phenol resin, benzocyclobutene (BCB), polybenzoxazole (PBO), or other suitable polymer-based dielectric materials. The first inter-dielectric layer 122, for example, may be formed by suitable fabrication techniques such as spin-on coating, chemical vapor deposition (CVD), plasma-enhanced chemical vapor deposition (PECVD), or the like. In some embodiments, a material of the first patterned conductive layers 124 and the first conductive vias 126 includes aluminum, titanium, copper, nickel, tungsten, and/or alloys thereof. The first patterned conductive layers 124 and the first conductive vias 126 may be formed by, for example, electroplating, deposition, and/or photolithography and etching. It should be noted that the number of the first patterned conductive layers 124, the first conductive vias 126, and the dielectric layers in the first inter-dielectric layer 122 shown in FIG. 1A is merely an illustration, and the disclosure is not limited. In some alternative embodiments, the number of the first patterned conductive layers 124, the number of the first conductive vias 126, and the number of the dielectric layers in the first inter-dielectric layer 122 may be adjusted depending on the routing requirements.

In some embodiments, the first bonding structure 130 includes a first dielectric layer 132, a plurality of first pads 134, a plurality of first connectors 136, and a plurality of auxiliary connectors 138. In some embodiments, the first pads 134 are formed on the first interconnection structure 120 such that the first pads 134 are directly in contact with the topmost first conductive vias 126 of the first interconnection structure 120. In other words, the first interconnection structure 120 is sandwiched between the first pads 134 and the wafer substrate WS. In some embodiments, the first pads 134 are electrically connected to the first interconnection structure 120 through the topmost first conductive vias 126. In some embodiments, the first pads 134 may be aluminum pads, copper pads, or other suitable metal pads. It should be noted that the number and shape of the first pads 140 may be selected based on demand. In some embodiments, the first dielectric layer 132 is formed over the first pads 134 to seal the first pads 134. In some embodiments, a material of the first dielectric layer 132 includes oxides, such as silicon oxide or the like. Alternatively, the first dielectric layer 132 may include polyimide, epoxy resin, acrylic resin, phenol resin, benzocyclobutene (BCB), polybenzoxazole (PBO), or any other suitable polymer-based dielectric material. The first dielectric layer 132, for example, may be formed by suitable fabrication techniques such as spin-on coating, CVD, PECVD, or the like.

In some embodiments, the first connectors 136 and the auxiliary connectors 138 may be formed by removing a portion of the first dielectric layer 132 and filling a conductive material into the gap. For example, the first connectors 136 and the auxiliary connectors 138 may be formed by a dual damascene process. As a result, each first connector 136 may include a via portion 136*a* and a trench portion 136*b* stacked on the via portion 136*a*. Similarly, each auxiliary connector 138 may also include a via portion 138*a* and a trench portion 138*b* stacked on the via portion 138*a*. In some embodiments, a width of the trench portion 136*b* is greater than a width of the via portion 136*a*. Similarly, a width of the trench portion 138*b* is greater than a width of the via portion 138*a*. In some embodiments, the first connectors 136 and the auxiliary connectors 138 may be made of, for example, aluminum, titanium, copper, nickel, tungsten, and/or alloys thereof. In some embodiments, the first connectors 136 and the auxiliary connectors 138 are simultaneously formed. However, the disclosure is not limited thereto. In some alternative embodiments, the first connectors 136 and the auxiliary connectors 138 may be formed separately. For example, the first connectors 136 may be formed prior to or after the formation of the auxiliary connectors 138. As illustrated in FIG. 1A, the first connectors 136 are disposed on the first pads 134 and are directly in contact with the first pads 134. In some embodiments, the first connectors 136 are electrically connected to the first interconnection structure 120 through the first pads 134. On the other hand, the auxiliary connectors 138 extend into the first inter-dielectric layer 122 to be in direct contact with the topmost first patterned conductive layer 124, thereby rendering electrical connection with the first interconnection structure 120. However, the foregoing configuration is merely an illustration, and the disclosure is not limited thereto. In some alternative embodiments, the configurations of the first connectors 136 and the auxiliary connectors 138 may be identical. In other words, additional pads may be formed directly underneath the auxiliary connectors 138 such that the auxiliary connectors 138 are electrically connected to the first interconnection structure 120 through these additional pads. As illustrated in FIG. 1A, the first connectors 136 and the auxiliary connectors 138 are embedded in the first dielectric layer 132.

In some embodiments, the semiconductor wafer W has a height $H_W$ of about 500 μm to about 775 μm. In some embodiments, top surfaces of the first connectors 136, top surfaces of the auxiliary connectors 138, and a top surface of the first dielectric layer 132 may be collectively referred to as an active surface AS1 of the semiconductor wafer W. On the other hand, the surface of the semiconductor wafer W opposite to the active surface AS1 may be referred to as a rear surface RS1 of the semiconductor wafer W. As shown in FIG. 1A, the top surfaces of the first connectors 136, the top surfaces of the auxiliary connectors 138, and the top surface of the first dielectric layer 132 are substantially located at the same level height to provide an appropriate active surface AS1 for hybrid bonding.

Figure 1B:
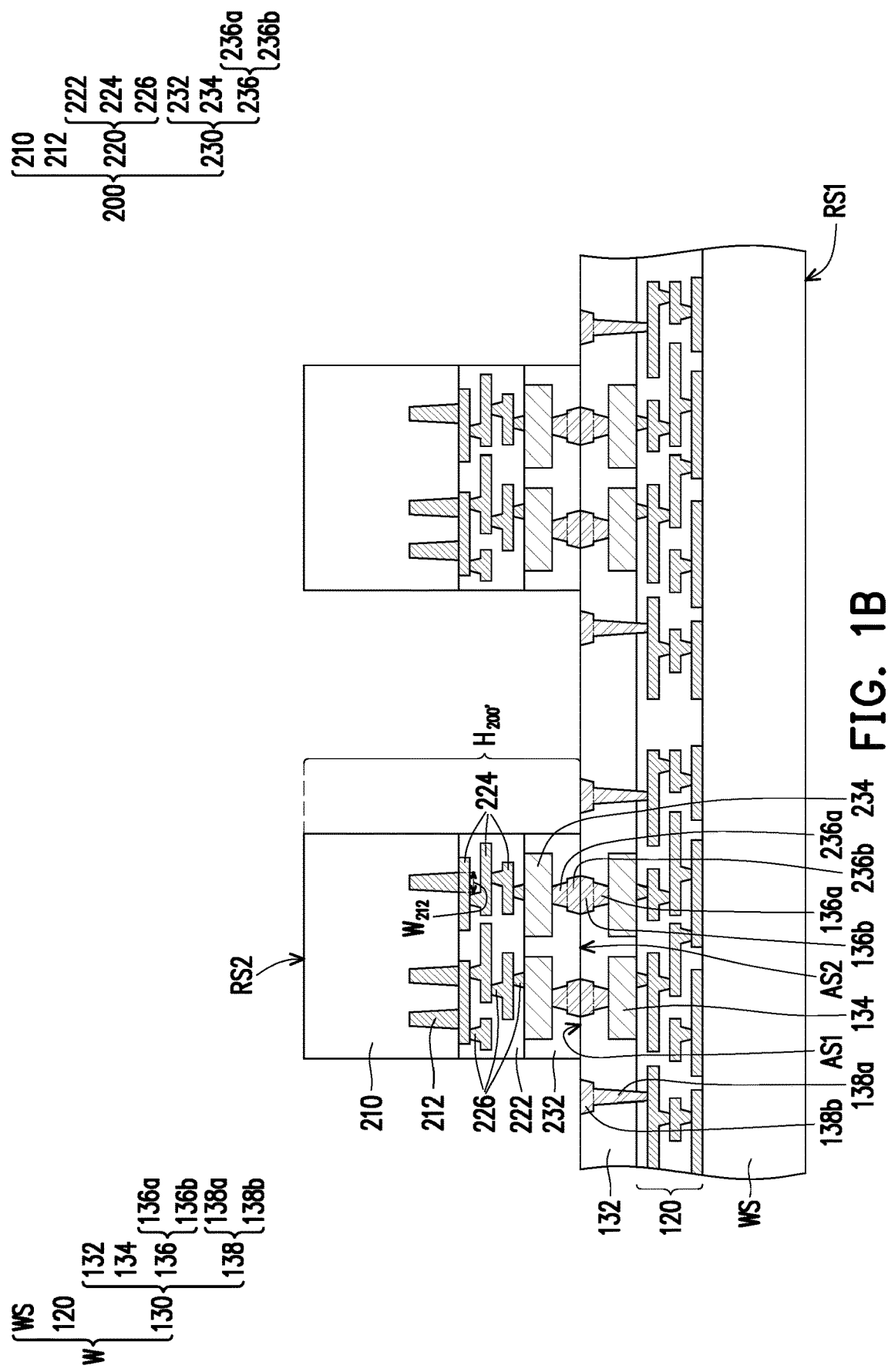

Referring to FIG. 1B, a plurality of semiconductor dies 200 are provided. In some embodiments, each semiconductor die 200 includes a semiconductor substrate 210 and a second interconnection structure 220 formed on the semiconductor substrate 210. In some embodiments, each semiconductor die 200 has a second bonding structure 230 formed thereon, and the second bonding structure 230 is also considered as part of the semiconductor die 200. In some embodiments, each semiconductor die 200 further includes a plurality of through semiconductor vias (TSV) 212 formed therein. For examples, the TSVs 212 are embedded in the semiconductor substrate 210 and are electrically connected to the second interconnection structure 220. In some embodiments, each TSV 212 has a width $W_{212}$ of about 0.9 μm to about 10 μm. On the other hand, two adjacent TSVs 212 have a pitch ranging between about 3 μm and about 50 μm.

In some embodiments, the semiconductor substrates 210 of the semiconductor dies 200 may be similar to the wafer substrate WS of the semiconductor wafer W, so the detailed descriptions thereof is omitted herein. As illustrated in FIG. 1B, the second interconnection structure 220 is disposed on the semiconductor substrate 210. In some embodiments, the second interconnection structure 220 includes a second inter-dielectric layer 222, a plurality of second patterned conductive layers 224, and a plurality of second conductive vias 226. The second inter-dielectric layer 222, the second patterned conductive layers 224, and the second conductive vias 226 of the second interconnection structure 220 may be respectively similar to the first inter-dielectric layer 122, the first patterned conductive layers 124, and the first conductive vias 126 of the first interconnection structure 120, so the detailed descriptions thereof are omitted herein. As illustrated in FIG. 1B, the TSVs 212 are directly in contact with one of the second patterned conductive layers 224. That is, the TSVs 212 is electrically connected to the second interconnection structure 220 through one of the second patterned conductive layers 224.

In some embodiments, the second bonding structure 230 includes a second dielectric layer 232, a plurality of second pads 234, and a plurality of second connectors 236. The second dielectric layer 232, the second pads 234, and the second connectors 236 of the second bonding structure 230 may be respectively similar to the first dielectric layer 132, the first pads 134, and the first connectors 136 of the first bonding structure 230, so the detailed descriptions thereof are omitted herein. In some embodiments, the second connectors 236 may be formed by a dual damascene process. That is, each second connector 236 may include a via portion 236a and a trench portion 236b stacked on the via portion 236a. In some embodiments, a width of the trench portion 236b is greater than a width of the via portion 236a. As illustrated in FIG. 1B, the second connectors 236 and the second pads 234 are embedded in the second dielectric layer 232. On the other hand, the second interconnection structure 220 is sandwiched between the second pads 234 and the semiconductor substrate 210.

In some embodiments, each semiconductor die 200 has a height $H_{200'}$ of about 40 µm to about 200 µm. As illustrated in FIG. 1B, bottom surfaces of the second connectors 236 and a bottom surface of the second dielectric layer 232 may be collectively referred to as an active surface AS2 of the semiconductor die 200. On the other hand, the surface of the semiconductor die 200 opposite to the active surface AS2 may be referred to as a rear surface RS2 of the semiconductor die 200. As shown in FIG. 1B, the bottom surfaces of the second connectors 236 and the bottom surface of the second dielectric layer 232 are substantially located at the same level height to provide an appropriate active surface AS2 for hybrid bonding.

In some embodiments, the semiconductor dies 200 may be dies capable of performing storage function. For example, the semiconductor dies 200 may be Dynamic Random Access Memory (DRAM), Resistive Random Access Memory (RRAM), Static Random Access Memory (SRAM), or the like. However, the disclosure is not limited thereto. In some alternative embodiments, the semiconductor dies 200 may be Central Process Unit (CPU) dies, Graphic Process Unit (GPU) dies, Field-Programmable Gate Array (FPGA), or the like.

As illustrated in FIG. 1B, the semiconductor dies 200 are bonded to the semiconductor wafer W. In some embodiments, the semiconductor dies 200 may be bonded to the semiconductor wafer W through a hybrid bonding process. In some embodiments, a temperature of the hybrid bonding process ranges from about 150° C. to about 400° C. The hybrid bonding process will be described in detail below.

In some embodiments, the semiconductor dies 200 may be picked-and-placed onto the active surface AS1 of the semiconductor wafer W such that the semiconductor dies 200 are electrically connected to the semiconductor wafer W. In some embodiments, the semiconductor dies 200 are placed such that the active surfaces AS2 of the semiconductor dies 200 are in contact with the active surface AS1 of the semiconductor wafer W. Meanwhile, the second connectors 236 of the semiconductor dies 200 are substantially aligned and in direct contact with the first connectors 136 of the semiconductor wafer W. For example, the trench portion 136b of each first connector 136 is substantially aligned and in direct contact with the corresponding trench portion 236b of each second connector 236.

In some embodiments, to facilitate the hybrid bonding between the semiconductor dies 200 and the semiconductor wafer W, surface preparation for bonding surfaces (i.e. the active surface AS1 and the active surfaces AS2) of the semiconductor dies 200 and the semiconductor wafer W may be performed. The surface preparation may include surface cleaning and activation, for example. Surface cleaning may be performed on the active surfaces AS1, AS2 to remove particles on the bonding surfaces of the first connectors 136, the bonding surfaces of the second connectors 236, the bonding surface of the first dielectric layer 132, and the bonding surface of the second dielectric layer 232. In some embodiments, the active surfaces AS1, AS2 may be cleaned by wet cleaning, for example. Not only particles are removed, but also native oxide formed on the bonding surfaces of the first connectors 136 and the second connectors 236 may be removed. The native oxide formed on the bonding surfaces of the first connectors 136 and the second connectors 236 may be removed by chemicals used in wet cleaning processes, for example.

After cleaning the active surface AS1 of the semiconductor wafer W and the active surface AS2 of the semiconductor dies 200, activation of the bonding surfaces of the first dielectric layer 132 and the second dielectric layer 232 may be performed for development of high bonding strength. In some embodiments, plasma activation may be performed to treat the bonding surfaces of the first dielectric layer 132 and the second dielectric layer 232. When the activated bonding surface of the first dielectric layer 132 is in contact with the activated bonding surface of the second dielectric layer 232, the first dielectric layer 132 of the semiconductor wafer W and the second dielectric layer 232 of the semiconductor dies 200 are pre-bonded.

After pre-bonding the semiconductor dies 200 onto the semiconductor wafer W, hybrid bonding of the semiconductor dies 200 and the semiconductor wafer W is performed. The hybrid bonding of the semiconductor dies 200 and the semiconductor wafer W may include a thermal treatment for dielectric bonding and a thermal annealing for conductor bonding. In some embodiments, the thermal treatment for dielectric bonding is performed to strengthen the bonding between the first dielectric layer 132 and the second dielectric layer 232. For example, the thermal treatment for dielectric bonding may be performed at temperature ranging from about 200° C. to about 400° C. After performing the thermal treatment for dielectric bonding, the thermal annealing for conductor bonding is performed to facilitate the bonding between the first connectors 136 and the second connectors 236. For example, the thermal annealing for conductor bonding may be performed at temperature ranging from about 150° C. to about 400° C. After performing the thermal annealing for conductor bonding, the first dielectric layer 132 is hybrid bonded to the second dielectric layer 232 and the first connectors 136 are hybrid bonded to the second connectors 236. For example, the first dielectric layer 132 is directly in contact with the second dielectric layer 232. Similarly, the first connectors 136 are directly in contact with the second connectors 236. As such, the first bonding structure 130 is hybrid bonded to the second bonding structure 230.

Figure 1C:
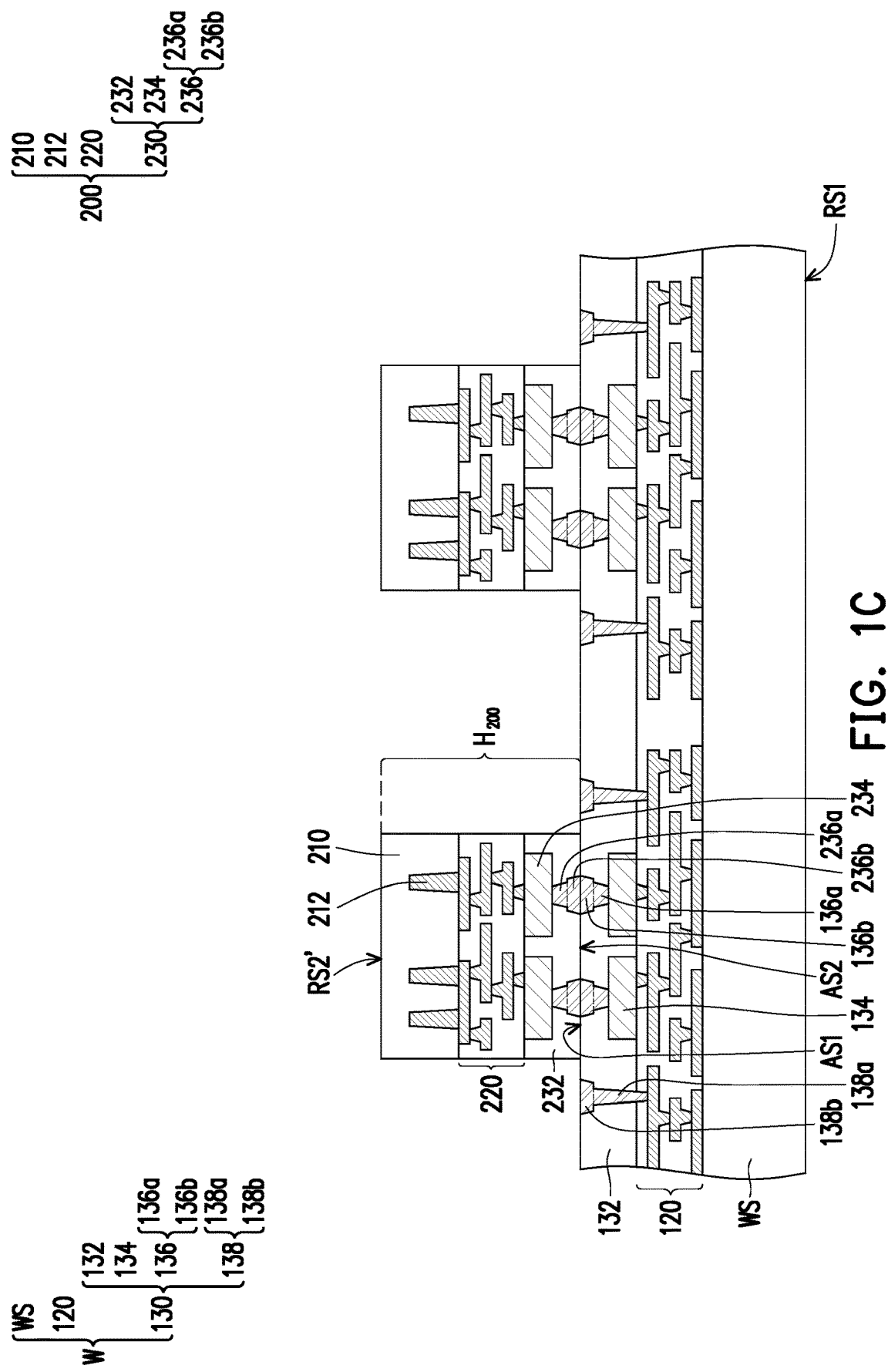

Referring to FIG. 1B and FIG. 1C, after the semiconductor dies 200 are hybrid bonded to the semiconductor wafer W, the height $H_{200'}$ of the semiconductor dies 200 is reduced. For example, a portion of the semiconductor substrate 210 is removed such that rear surfaces RS2' of the semiconductor dies 200 shown in FIG. 1C are located at a level height lower than the rear surfaces RS2 shown in FIG. 1B. In some embodiments, the semiconductor substrate 210 may be partially removed through a planarization process. In some embodiments, the planarization process includes a mechanical grinding process, a chemical mechanical polishing (CMP) process, or the like. As illustrated in FIG. 1C, after performing the planarization process, the TSVs 212 are still not revealed. That is, during this stage, a thickness of the semiconductor substrate 210 is greater than a height of TSVs 212. In some embodiments, after performing the planarization process, each semiconductor die 200 has a height $H_{200}$ ranging from about 15 μm to about 30 μm.

Figure 1D:
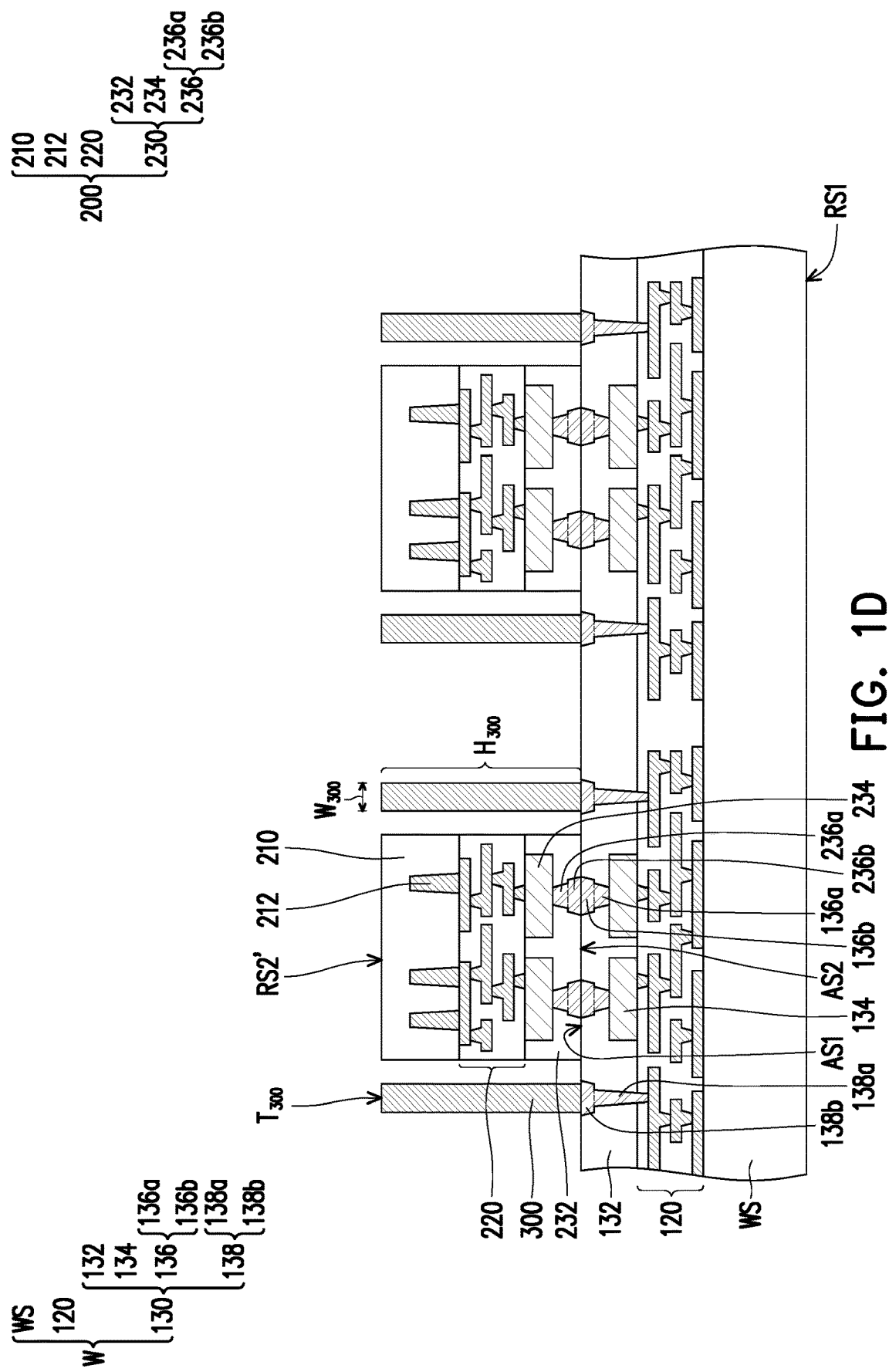

Referring to FIG. 1D, a plurality of through insulating vias (TIV) 300 are formed on the semiconductor wafer W. In some embodiments, the TIVs 300 are formed to surround the semiconductor dies 200 and are attached to the auxiliary connectors 138. For example, the TIVs 300 are plated on the trench portion 138b of the auxiliary connectors 138. In other words, the TIVs 300 are directly in contact with the auxiliary connectors 138 and are physically and electrically connected to the first bonding structure 130. The method of forming the TIVs 300 will be described in detail below. First, a protection layer (not shown) may be formed to protect the semiconductor dies 200. Subsequently, a seed material layer (not shown) is formed over the semiconductor wafer WS. In some embodiments, the seed material layer includes a titanium/copper composite layer and is formed by a sputtering process. Thereafter, a mask pattern (not shown) with openings is formed on the seed material layer. The openings of the mask pattern expose the intended locations for the subsequently formed TIVs 300. For example, the openings of the mask pattern may correspond to the location of the auxiliary connectors 138. Afterwards, a plating process is performed to form a metal material layer (e.g., a copper layer) on the seed material layer exposed by the openings of the mask pattern. The mask pattern, the seed material layer not covered by the metal material layer, and the protection layer are then removed a stripping process and an etching process to form the TIVs 300. However, the disclosure is not limited thereto. In some alternative embodiments, other suitable methods may be utilized to form the conductive structures 300. For example, pre-fabricated TIVs 300 may be picked-and-placed onto the semiconductor wafer W.

In some embodiments, the TIVs 300 are formed to have a width (critical dimension) $W_{300}$ of about 20 μm to about 50 μm. On the other hand, a height of the TIVs 300 may range between about 25 μm and about 40 μm. As illustrated in FIG. 1D, the TIVs 300 are formed to have substantially the same height as that of the semiconductor dies 200, and the rear surfaces RS2' of the semiconductor dies 200 and top surfaces $T_{300}$ of the TIVs 300 are located at substantially the same level height. However, the disclosure is not limited thereto. In some alternative embodiments, the TIVs 300 may be shorter than or taller than the semiconductor dies 200. For example, the rear surfaces RS2' of the semiconductor dies 200 may be located at a level height higher than or lower than the top surfaces $T_{300}$ of the TIVs 300.

It should be noted that although FIG. 1B to FIG. 1D shown that the semiconductor dies 200 are hybrid bonded to the semiconductor wafer W prior to the formation of the TIVs 300, the disclosure is not limited thereto. In some alternative embodiments, the TIVs 300 may be plated on the semiconductor wafer W before the semiconductor dies 200 are hybrid bonded to the semiconductor wafer W.

Figure 1E:
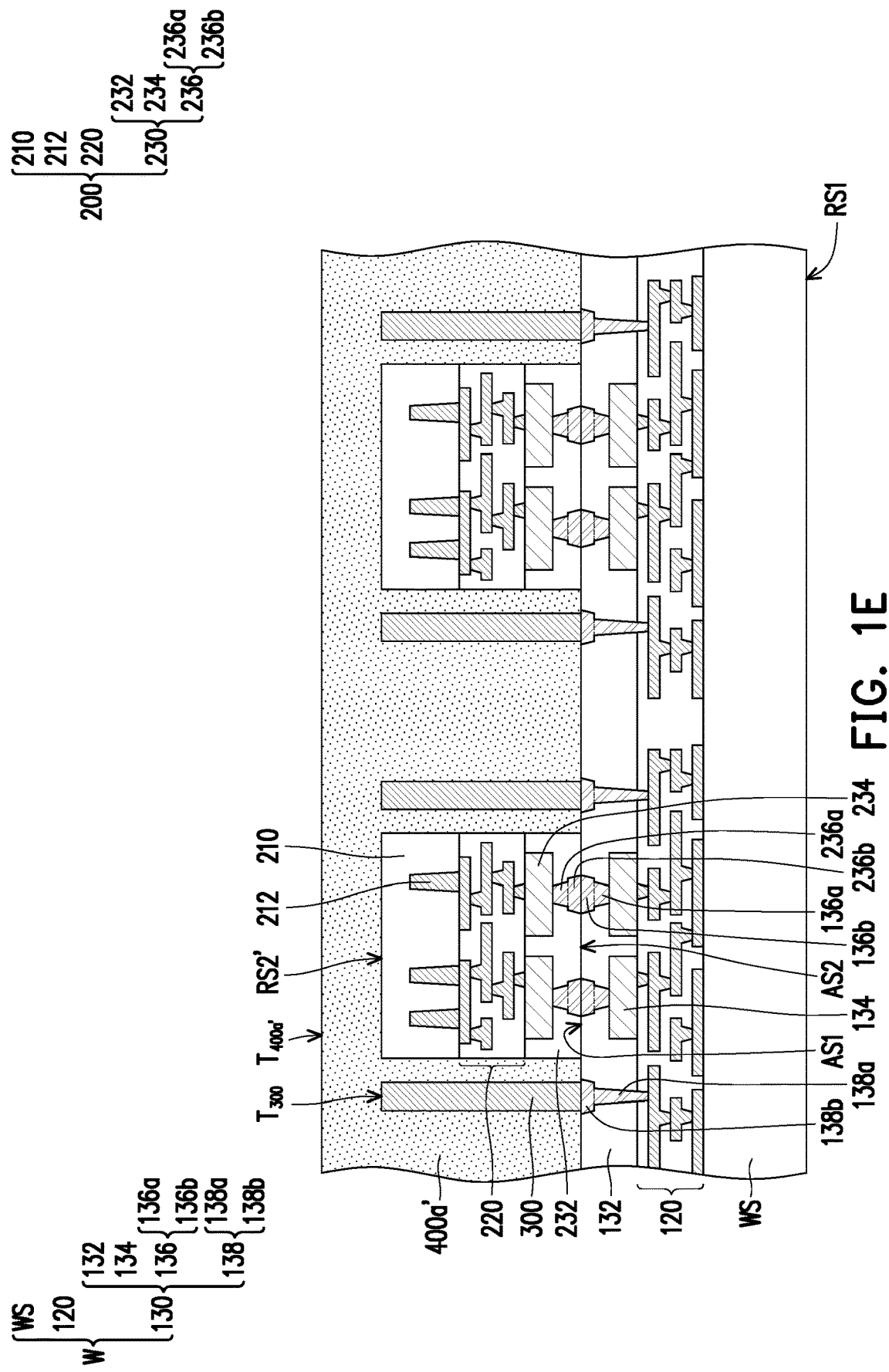

Referring to FIG. 1E, a first encapsulant material 400a' is formed over the semiconductor wafer W to encapsulate the semiconductor dies 200 and the TIVs 300. In some embodiments, the TIVs 300 and the semiconductor substrate 210 of the semiconductor dies 200 are not revealed and are well protected by the first encapsulant material 400a'. For example, a top surface $T_{400a'}$ of the first encapsulant material 400a' is located at a level height higher than the top surfaces $T_{300}$ of the TIVs 300 and the rear surfaces RS2' of the semiconductor dies 200. In some embodiments, the first encapsulant material 400a' includes a molding compound, a molding underfill, or the like. Alternatively, the first encapsulant material 400a' may be a polymeric material, such as polyimide, epoxy resin, acrylic resin, phenol resin, BCB, PBO, or other suitable polymer-based dielectric materials. In some embodiments, the first encapsulant material 400a' may include fillers. Alternatively, the first encapsulant material 400a' may be free of fillers. In some embodiments, the first encapsulant material 400a' may be formed by a molding process (such as a compression molding process) or a spin-coating process. In some embodiments, after the first encapsulant material 400a' is formed on the semiconductor wafer W, the structure illustrated in FIG. 1E may be turned upside down and the rear surface RS1 of the semiconductor wafer W may be thinned to reduce the overall thickness of the subsequently formed package. In some embodiments, the rear surface RS1 of the semiconductor wafer W may be thinned through a mechanical grinding process, a CMP process, or the like. It should be noted that the step of thinning the rear surface RS1 of the semiconductor wafer W may be optional, so such step is not shown in FIG. 1E.

Figure 1F:
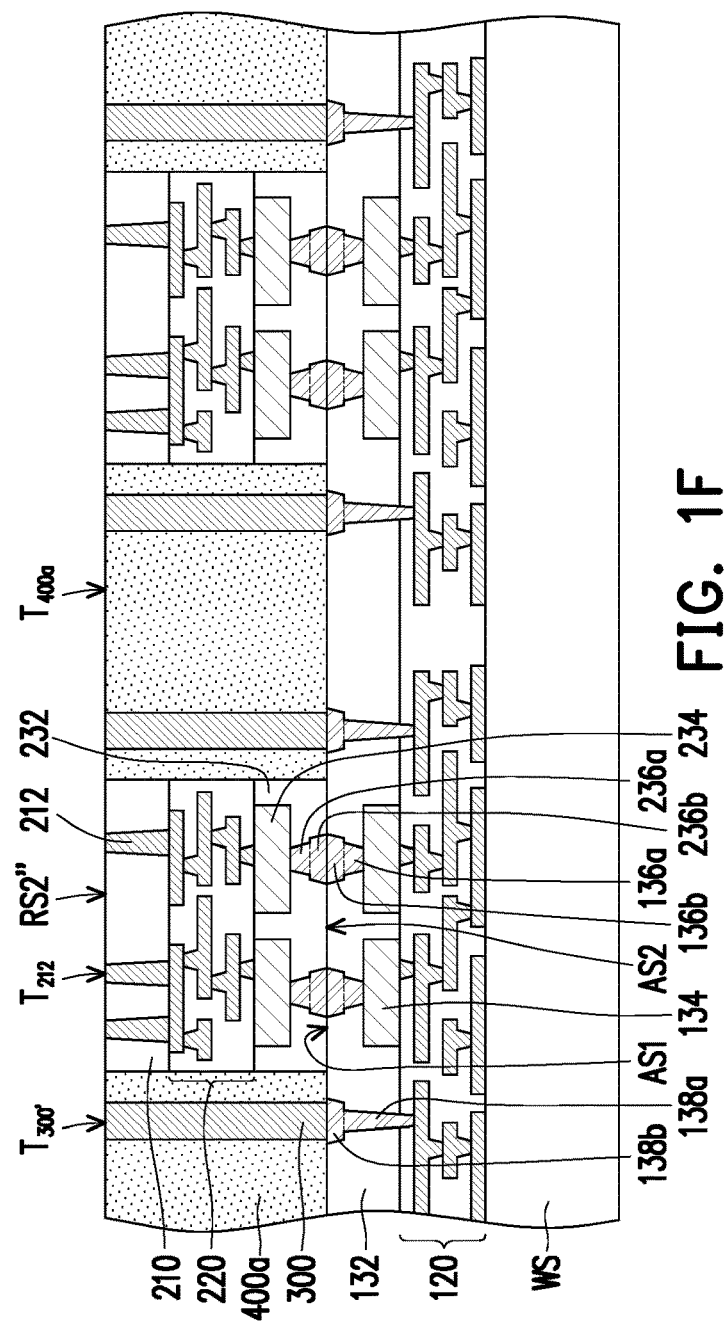

Referring to FIG. 1E and FIG. 1F, the first encapsulant material 400a', the TIVs 300, and the semiconductor dies 200 are thinned until the TIVs 300 and the TSVs 212 are both exposed. In some embodiments, the first encapsulant material 400a', the TIVs 300, and the semiconductor dies 200 may be thinned through a grinding process, such as a mechanical grinding process, a CMP process, or the like. After the first encapsulant material 400a' is grinded, a first encapsulant 400a is formed over the semiconductor wafer W to encapsulate the semiconductor dies 200 and the TIVs 300. As illustrated in FIG. 1E and FIG. 1F, since the TSVs 212 are embedded in the semiconductor substrate 210 of the semiconductor dies 200, portions of the semiconductor substrate 210 is removed to reveal the TSVs 212. Meanwhile, portions of the TIVs 300 are also removed. After grinding, the semiconductor die 200 has a rear surface RS2" that is substantially coplanar with top surfaces $T_{300'}$ of the TIVs 300, a top surface $T_{400a}$ of the first encapsulant 400a, and top surfaces $T_{212}$ of the TSVs 212. In some embodiments, the TSVs 212 penetrate through at least a portion of each semiconductor die 200. For example, the TSVs 212 may penetrate through the semiconductor substrate 210 of the semiconductor dies 200.

As illustrated in FIG. 1F, the first encapsulant 400a laterally encapsulates the semiconductor dies 200 and the TIVs 300. In some embodiments, the TIVs 300 penetrate through the first encapsulant 400a. In some embodiments, the first dielectric layer 132 of the first bonding structure 130 and the second dielectric layer 232 are attached to the first encapsulant 400a. For example, the first dielectric layer 132 and the second dielectric layer 232 are directly in contact with the first encapsulant 400a. In some embodiments, the second dielectric layer 232 is laterally covered by the first encapsulant 400a.

Figure 1G:
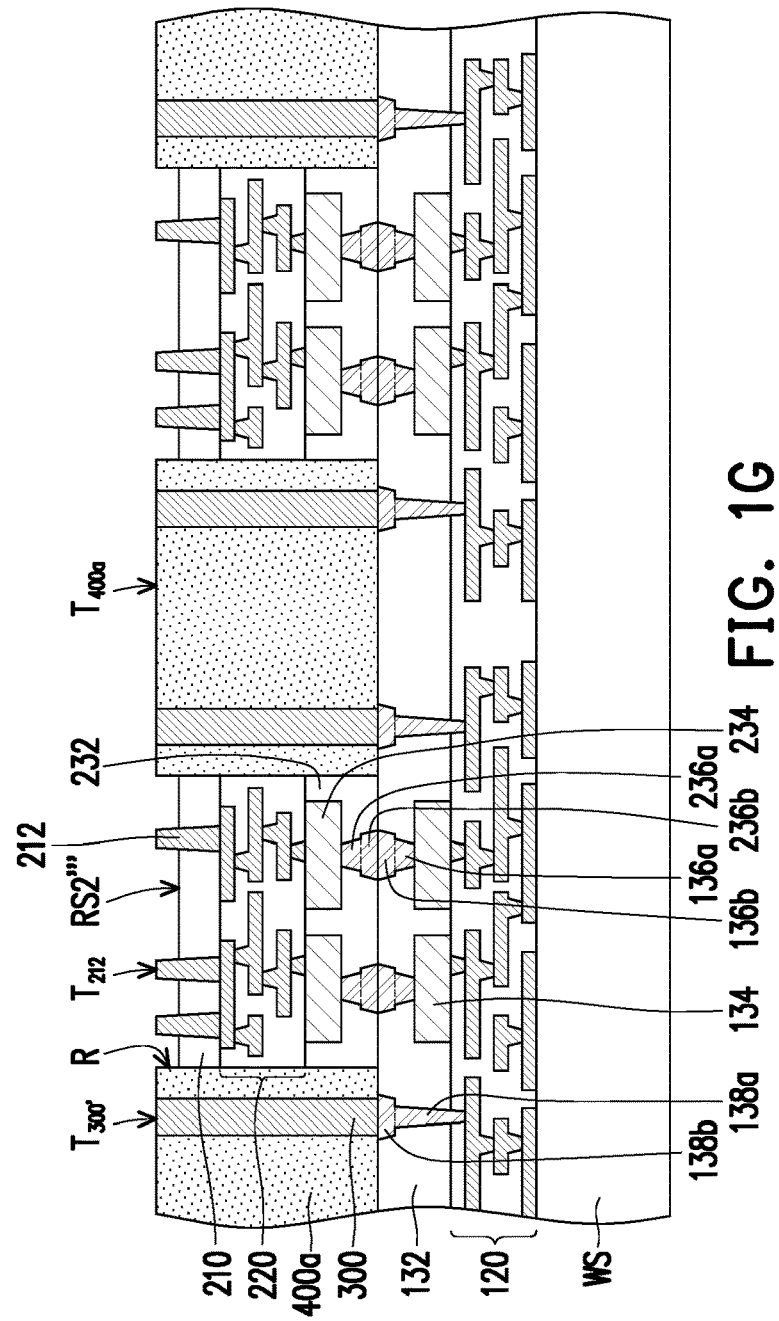

Referring to FIG. 1G, a portion of each semiconductor die 200 is removed to form a plurality of recesses R. For example, a portion of the semiconductor substrate 210 is removed to form the recesses R. As illustrated in FIG. 1G, the TSVs 212 are partially located in the recess R. In some embodiments, at least a portion of each TSV 212 protrudes from the semiconductor substrate 210 of the semiconductor dies 200. That is, the top surfaces $T_{212}$ of the TSVs 212 are located at a level height higher than the rear surfaces RS2''' of the semiconductor dies 200. In some embodiments, the semiconductor substrate 210 may be partially removed through an etching process. The etching process includes, for example, an isotropic etching process and/or an anisotropic etching process. For example, the semiconductor substrate 210 may be partially removed through a wet etching process, a dry etching process, or a combination thereof.

Figure 1H:
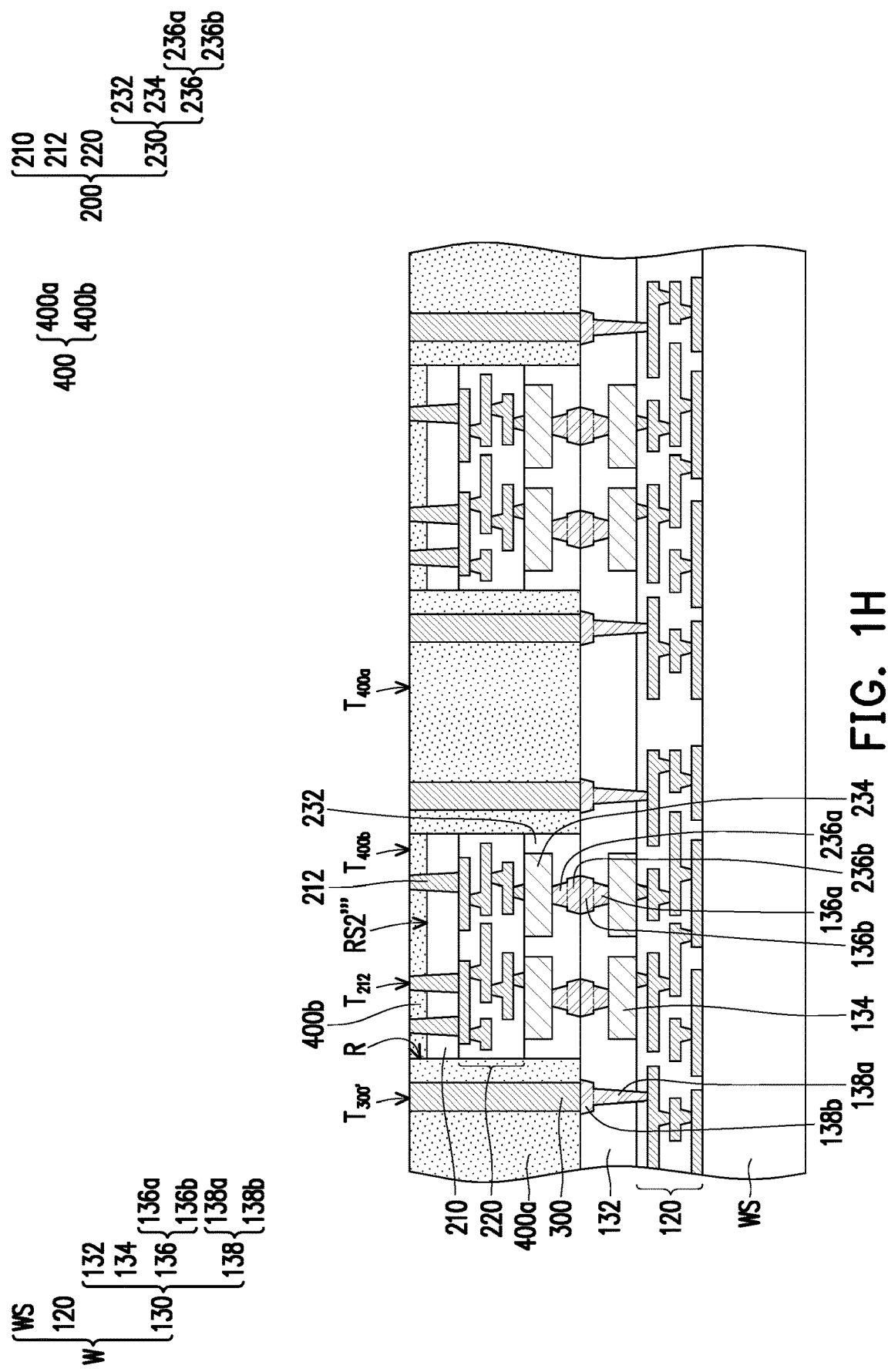

Referring to FIG. 1H, a second encapsulant 400b is formed to fill the recesses R. In some embodiments, the second encapsulant 400b includes a molding compound, a molding underfill, or the like. Alternatively, the second encapsulant 400b may be a polymeric material, such as polyimide, epoxy resin, acrylic resin, phenol resin, BCB, PBO, or other suitable polymer-based dielectric materials. In some embodiments, the second encapsulant 400b may include fillers. Alternatively, the second encapsulant 400b may be free of fillers. In some embodiments, a material of the second encapsulant 400b may be identical to the material of the first encapsulant 400a. However, the disclosure is not limited thereto. In some alternative embodiments, the material of the second encapsulant 400b may be different from the material of the first encapsulant 400a. In some embodiments, the first encapsulant 400a and the second encapsulant 400b may be collectively referred to as an encapsulant 400. As illustrated in FIG. 1H, the protruding portion of each TSV 212 is encapsulated by the second encapsulant 400b. That is, each TSV 212 is partially wrapped around by the encapsulant 400. In some embodiments, the encapsulant 400 covers sidewalls and rear surfaces RS2''' of the semiconductor dies 200. In some embodiments, the second encapsulant 400b may be formed by an over-molding process. For example, a second encapsulant material (not shown) may be formed on the first encapsulant 400a and the TIVs 300. The second encapsulant material also fills up the recesses R. Thereafter, the second encapsulant material is thinned until the TIVs 300 and the TSVs 212 are revealed, so as to form the second encapsulant 400b. In some embodiments, the second encapsulant material may be thinned through a mechanical grinding process, a CMP process, or the like. As illustrated in FIG. 1H, the top surface $T_{400a}$ of the first encapsulant 400a, the top surfaces $T_{300}$ of the TIVs 300, the top surfaces $T_{212}$ of the TSVs 212, and a top surface $T_{400b}$ of the second encapsulant 400b are substantially coplanar.

Figure 1I:
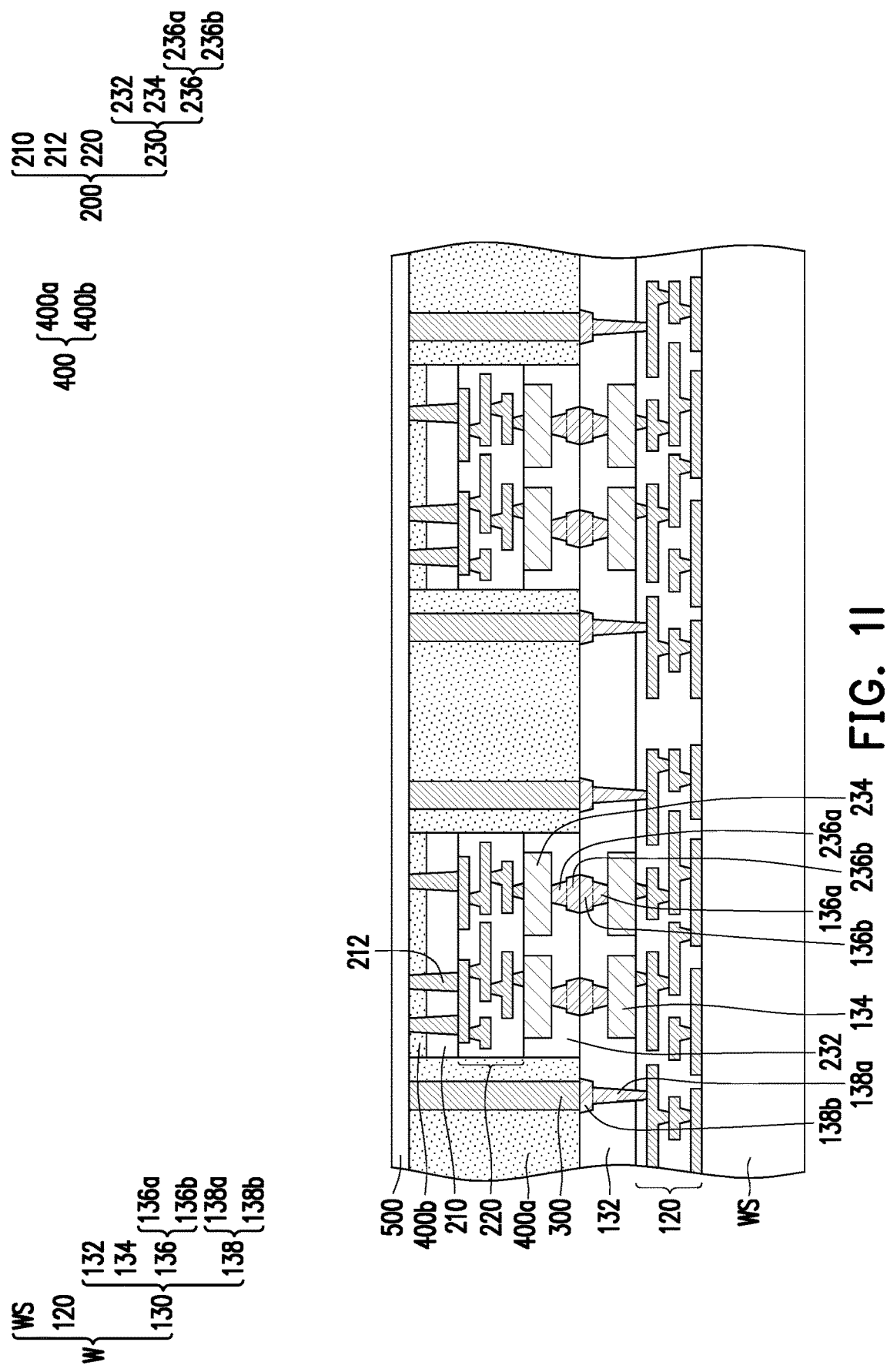

Referring to FIG. 1I, a dielectric layer 500 is formed over the encapsulant 400 and the TIVs 300. In some embodiments, a material of the dielectric layer 500 includes polyimide, epoxy resin, acrylic resin, phenol resin, BCB, PBO, or any other suitable polymer-based dielectric material. The dielectric layer 500, for example, may be formed by suitable fabrication techniques such as spin-on coating, CVD, PECVD, or the like.

Figure 1J:
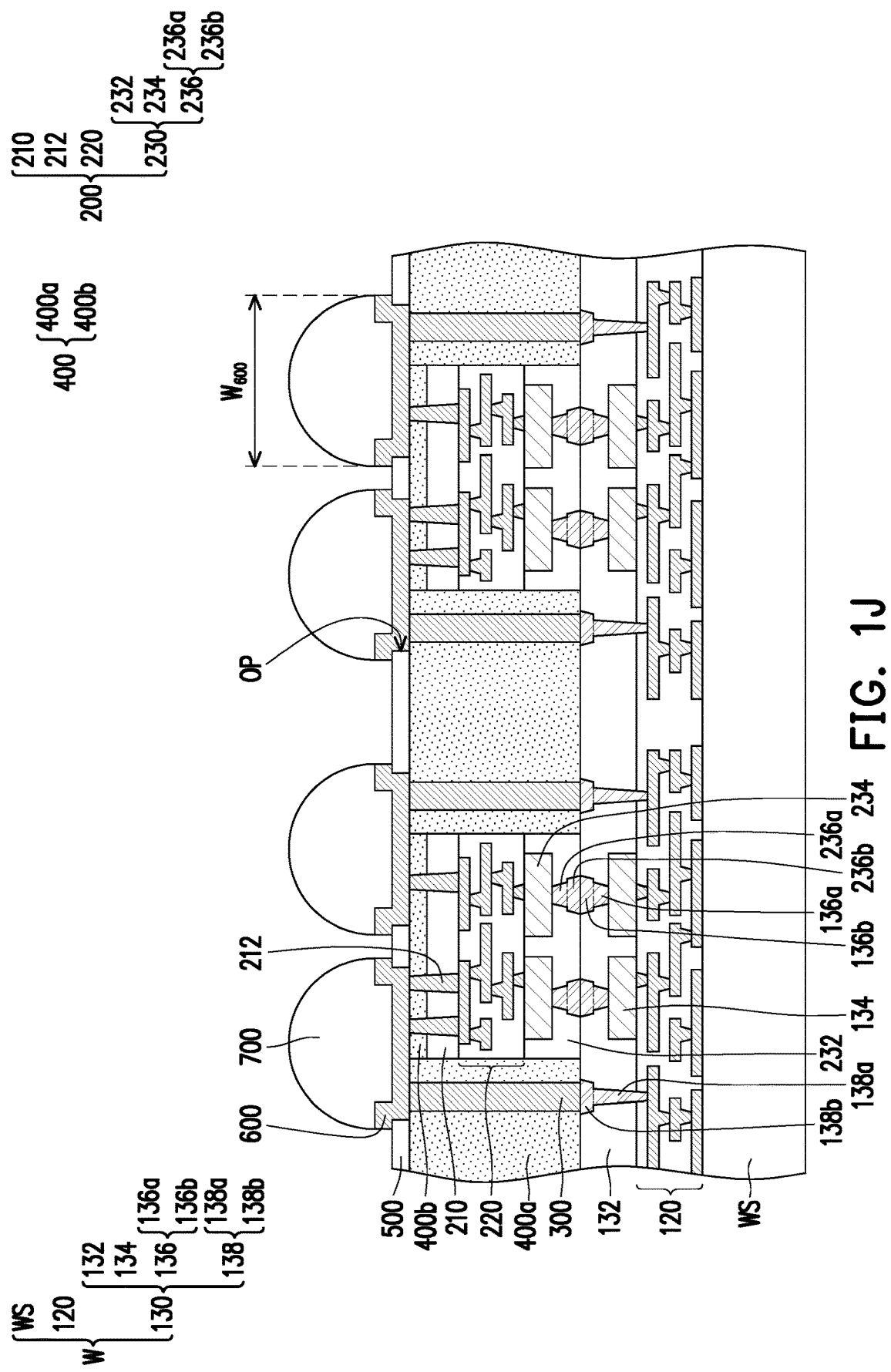

Referring to FIG. 1J, a plurality of under-ball metallurgy (UBM) patterns 600 and a plurality of conductive terminals 700 are sequentially formed over the first encapsulant 400a, the second encapsulant 400b, the TSVs 212, and the TIVs 300. In some embodiments, the UBM patterns 600 may be formed by the following steps. First, a plurality of contact openings OP is formed in the dielectric layer 500. The contact openings OP at least expose each TSV 212 and each TIV 300. Then, a seed material layer (not shown) is formed over the dielectric layer 500 and in the contact openings OP. The seed material layer extends into the contact openings OP to be in direct contact with the TSVs 212 and the TIVs 300. In some embodiments, the seed material layer includes a titanium/copper composite layer and is formed by a sputtering process. Then, a mask pattern (not shown) having openings is formed on the seed material layer. The openings of the mask pattern expose the intended location for the subsequently formed UBM patterns 600. For example, the openings of the mask pattern may expose the seed material layer located inside of the contact openings OP and the seed material layer in proximity of the contact openings OP. Afterwards, a plating process is performed to form a conductive material layer on the seed material layer exposed by the openings of the mask pattern. In some embodiments, a material of the conductive material layer includes aluminum, titanium, copper, nickel, tungsten, and/or alloys thereof. The mask pattern and the underlying seed material layer are then removed by a stripping process and an etching process. The remaining seed material layer and the conductive material layer then constitute the UBM patterns 600.

In some embodiments, the UBM patterns 600 are connected to the TSVs 212 and the TIVs 300. As such, the UBM patterns 600 may be electrically connected to the semiconductor wafer W through the TIVs 300. Meanwhile, the UBM patterns 600 are also electrically connected to the semiconductor dies 200 through the TSVs 212. As illustrated in FIG. 1J, at least one of the TSVs 212 and at least one of the TIVs 300 are simultaneously connected to the same UBM pattern 600. In some embodiments, at least one UBM pattern 600 is connected to multiple TSVs 212. By having the UBM patterns 600 to land on multiple TSVs 212, the electrical resistance may be sufficiently reduced and the heat dissipation during operation of the device may be effectively enhanced. It should be noted that throughout the entire disclosure, the term "multiple" refers to "more than one." In some embodiments, each UBM pattern 600 is formed to have a width $W_{600}$ of about 40 µm to about 200 µm. On the other hand, two adjacent UBM patterns 600 may have a pitch ranging between about 100 µm and about 1000 µm.

In some embodiments, the conductive terminals 700 are disposed on the UBM patterns 600. In some embodiments, the conductive terminals 700 are attached to the UBM patterns 600 through a solder flux. In some embodiments, the conductive terminals 600 are, for example, solder balls, ball grid array (BGA) balls, or controlled collapse chip connection (C4) bumps. In some embodiments, the conductive terminals 700 are made of a conductive material with low resistivity, such as Sn, Pb, Ag, Cu, Ni, Bi, or an alloy thereof.

Figure 1K:
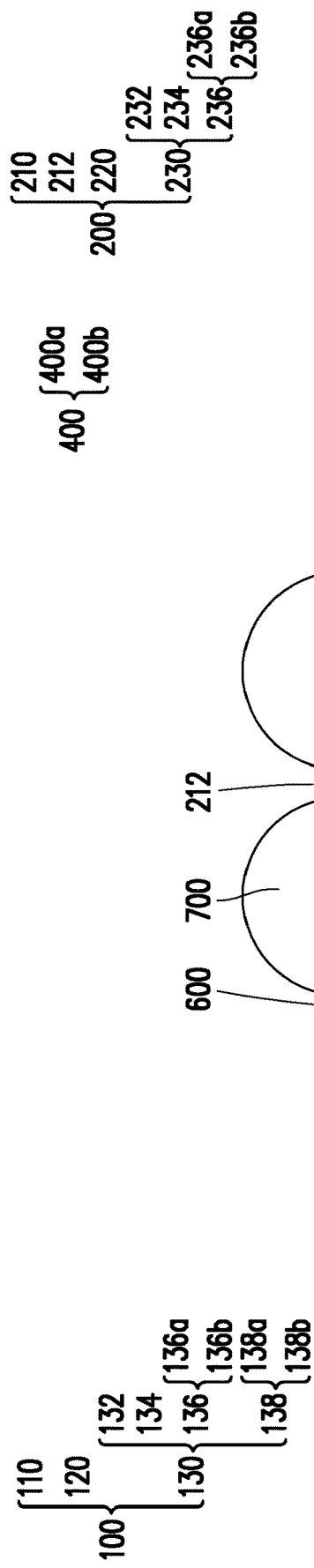
Figure 1K:
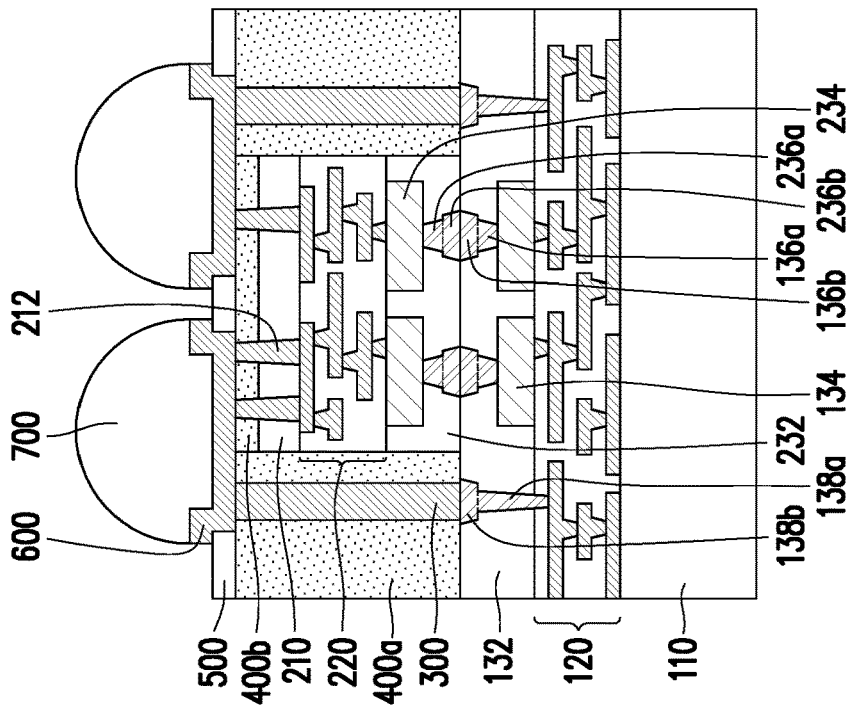

Referring to FIG. 1K, a singulation process is performed to form a plurality of packages 10. In some embodiments, the dicing process or the singulation process typically involves dicing with a rotating blade or a laser beam. In other words, the dicing or singulation process is, for example, a laser cutting process, a mechanical cutting process, or other suitable processes. In some embodiments, during the singulation process, the encapsulant 400 is being cut off and the semiconductor wafer W is being divided into multiple semiconductor dies 100. That is, each semiconductor die 100 includes a semiconductor substrate 110, the first interconnection structure 120 disposed on the semiconductor substrate 110, and the first bonding structure 130 disposed on the first interconnection structure 120. In some embodiments, the semiconductor die 100 may be referred to as a first die of the package 10 while the semiconductor die 200 may be referred to as a second die of the package 10.

In some embodiments, the steps illustrated in FIG. 1A to FIG. 1K may be referred to as "chip on wafer (CoW) level packaging." As illustrated in FIG. 1K, the semiconductor die 200 is stacked on the semiconductor die 100. In other words, multiple semiconductor dies 100, 200 are integrated into a single package 10. As such, the package 10 may be referred to as a "system on integrated circuit (SOIC) package." In some embodiments, by adapting the steps presented in FIG. 1A to FIG. 1K, heterogeneous or homogenous semiconductor components may be effectively integrated into a single package with lower cost. For example, known-good-dies (KDG) may be effectively integrated with a semiconductor wafer/a semiconductor die in a low cost. In addition, the stacking chip/die size may be flexible. Moreover, since the semiconductor dies 100, 200 are stacked on each other, the compactness of the package 10 may be enhanced. Furthermore, since the conductive terminals 700 are electrically connected to the semiconductor die 100 and the semiconductor die 200 respectively through the TIVs 300 and the TSVs 212, short electrical paths may be adapted. That is, the signal transmission performance of the package 10 may be effectively enhanced. In some embodiments, the package 10 may be utilized in flip-chip applications. That is, the package 10 may be further bonded onto a substrate, such as a printed circuit board (PCB) or the like, in a flip-chip manner.

Figure 2:
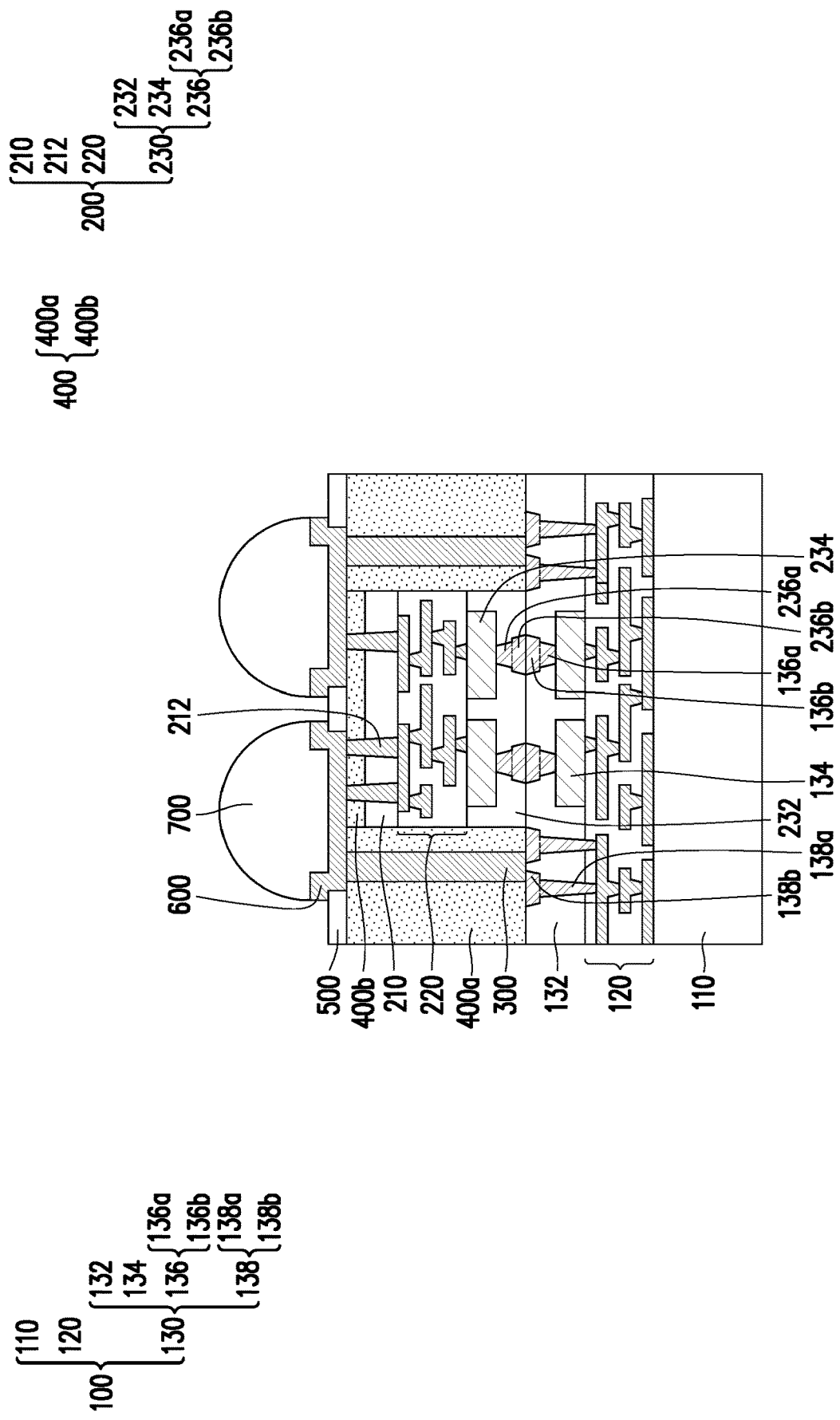
FIG. 2 is a schematic cross-sectional view illustrating a package in accordance with some alternative embodiments of the disclosure.

FIG. 2 is a schematic cross-sectional view illustrating a package 20 in accordance with some alternative embodiments of the disclosure. Referring to FIG. 2, the package 20 is similar to the package 10 in FIG. 1K, so the detailed description thereof is omitted herein. However, in package 20, each TIV 300 lands on multiple auxiliary connectors 138. That is, the trench portions 138b of multiple auxiliary connectors 138 are directly in contact with a same TIV 300.

In some embodiments, since the semiconductor dies 100, 200 are stacked on each other, the compactness of the package 20 may be enhanced. Furthermore, since the conductive terminals 700 are electrically connected to the semiconductor die 100 and the semiconductor die 200 respectively through the TIVs 300 and the TSVs 212, short electrical paths may be adapted. That is, the signal transmission performance of the package 20 may be effectively enhanced. In some embodiments, the package 20 may be utilized in flip-chip applications. That is, the package 20 may be further bonded onto a substrate, such as a PCB board or the like, in a flip-chip manner.

Figure 3:
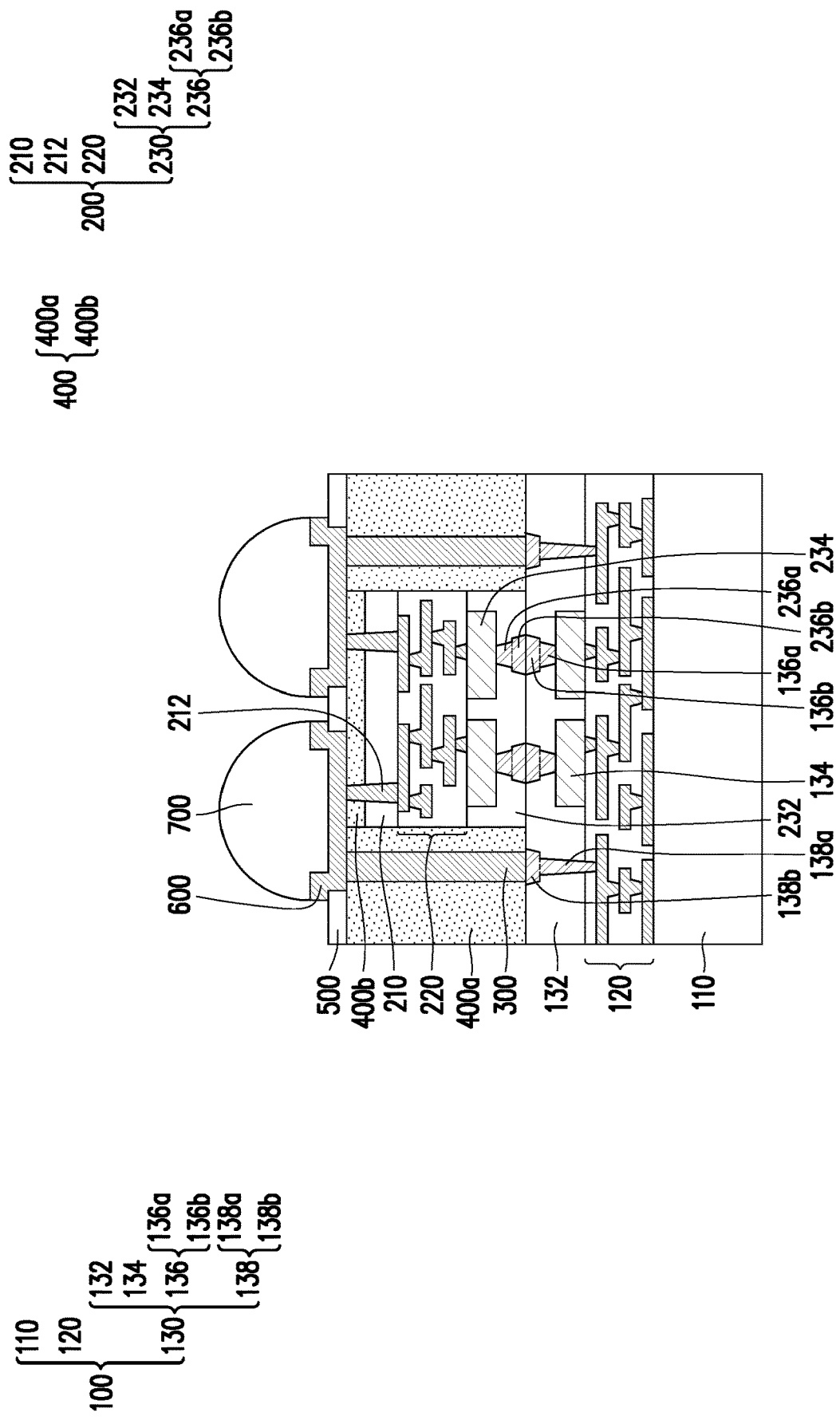
FIG. 3 is a schematic cross-sectional view illustrating a package in accordance with some alternative embodiments of the disclosure.

FIG. 3 is a schematic cross-sectional view illustrating a package 30 in accordance with some alternative embodiments of the disclosure. Referring to FIG. 3, the package 30 is similar to the package 10 in FIG. 1K, so the detailed description thereof is omitted herein. However, in package 30, each UBM pattern 600 is attached to one TSV 212 and one TIV 300. That is, each UBM pattern 600 is directly in contact with one of the TSVs 212 and one of the TIVs 300.

In some embodiments, since the semiconductor dies 100, 200 are stacked on each other, the compactness of the package 30 may be enhanced. Furthermore, since the conductive terminals 700 are electrically connected to the semiconductor die 100 and the semiconductor die 200 respectively through the TIVs 300 and the TSVs 212, short electrical paths may be adapted. That is, the signal transmission performance of the package 30 may be effectively enhanced. In some embodiments, the package 30 may be utilized in flip-chip applications. That is, the package 30 may be further bonded onto a substrate, such as a PCB board or the like, in a flip-chip manner.

Figure 4:
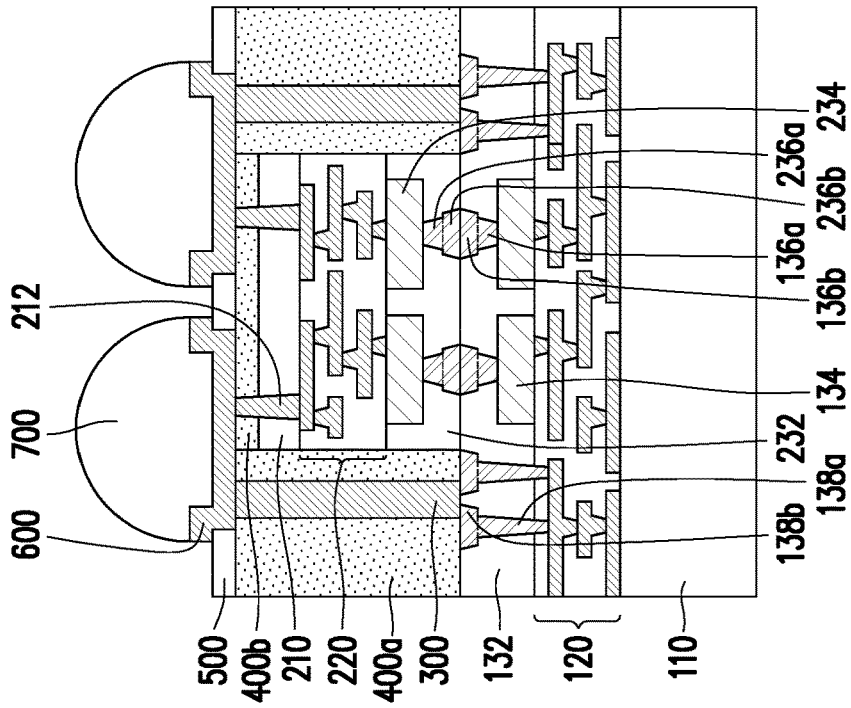
FIG. 4 is a schematic cross-sectional view illustrating a package in accordance with some alternative embodiments of the disclosure.

FIG. 4 is a schematic cross-sectional view illustrating a package 40 in accordance with some alternative embodiments of the disclosure. Referring to FIG. 4, the package 40 is similar to the package 10 in FIG. 1K, so the detailed description thereof is omitted herein. However, in package 40, each TIV 300 lands on multiple auxiliary connectors 138. That is, the trench portions 138b of multiple auxiliary connectors 138 are directly in contact with a same TIV 300. In addition, in package 40, each UBM pattern 600 is attached to one TSV 212 and one TIV 300. That is, each UBM pattern 600 is directly in contact with one of the TSVs 212 and one of the TIVs 300.

In some embodiments, since the semiconductor dies 100, 200 are stacked on each other, the compactness of the package 40 may be enhanced. Furthermore, since the conductive terminals 700 are electrically connected to the semiconductor die 100 and the semiconductor die 200 respectively through the TIVs 300 and the TSVs 212, short electrical paths may be adapted. That is, the signal transmission performance of the package 40 may be effectively enhanced. In some embodiments, the package 40 may be utilized in flip-chip applications. That is, the package 40 may be further bonded onto a substrate, such as a PCB board or the like, in a flip-chip manner.

In accordance with some embodiments of the disclosure, a package includes a first die, a second die, an encapsulant, and through insulating vias (TIV). The first die has a first bonding structure. The first bonding structure includes a first dielectric layer and first connectors embedded in the first dielectric layer. The second die has a second bonding structure. The second bonding structure includes a second dielectric layer and second connectors embedded in the second dielectric layer. The first dielectric layer is hybrid bonded to the second dielectric layer. The first connectors are hybrid bonded to the second connectors. The encapsulant laterally encapsulates the second die. The TIVs penetrate through the encapsulant and are connected to the first bonding structure.

In accordance with some alternative embodiments of the disclosure, a package includes a first die, a second die, and an encapsulant. The first die includes first pads, first connectors, and a first dielectric layer. The first connectors are on the first pads. The first dielectric layer encapsulates the first pads and the first connectors. The second die includes second pads, second connectors, and a second dielectric layer. The second connectors are on the second pads and are directly in contact with the first connectors. The second dielectric layer encapsulates the second pads and the second connectors. The second dielectric layer is directly in contact with the first dielectric layer. The encapsulant laterally encapsulates the second die. The encapsulant is directly in contact with the first dielectric layer.

In accordance with some embodiments of the disclosure, a manufacturing method of a package includes at least the following steps. A semiconductor wafer having a first bonding structure formed thereon is provided. Semiconductor dies are bonded to the semiconductor wafer. Each semiconductor die has a second bonding structure formed thereon and through semiconductor vias (TSV) formed herein. The first bonding structure is bonded to the second bonding structure. Through insulating vias (TIV) are formed to surround the semiconductor dies. The semiconductor dies and the TIVs are encapsulated by a first encapsulant. A portion of each semiconductor die is removed to form recesses. A second encapsulant is filled into the recesses. Under-ball metallurgy (UBM) patterns and conductive terminals are formed on the first encapsulant and the second encapsulant. The UBM patterns are connected to the TIVs and the TSVs.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
   a first die having a first bonding structure, wherein the first bonding structure comprises a first dielectric layer and first connectors embedded in the first dielectric layer;
   a second die having a semiconductor substrate and a second bonding structure over the semiconductor substrate, wherein the second bonding structure comprises a second dielectric layer and second connectors embedded in the second dielectric layer, sidewalls of the second dielectric layer are aligned with sidewalls of the semiconductor substrate, the first bonding structure is in physical contact with the second bonding structure such that the first dielectric layer is bonded to the second dielectric layer and the first connectors are bonded to the second connectors;
   an encapsulant laterally encapsulating the second die; and
   through insulating vias (TIV) aside the second die and connected to the first bonding structure.

2. The package according to claim 1, wherein the encapsulant covers a portion of a top surface of the first dielectric layer and the sidewalls of the second dielectric layer.

3. The package according to claim 1, wherein each first connector of the first connectors has a via portion and a trench portion stacked on the via portion, each second connector of the second connectors has a via portion and a trench portion stacked on the via portion, and the trench portion of the second connector is bonded to the trench portion of the first connector.

4. The package according to claim 1, wherein the first bonding structure further comprises auxiliary connectors embedded in the first dielectric layer, and the auxiliary connectors are attached to the TIVs.

5. The package structure according to claim 1, wherein the second die further comprises through semiconductor vias (TSV) penetrating through the semiconductor substrate of the second die.

6. The package structure according to claim 5, further comprising:
   under-ball metallurgy (UBM) patterns disposed on the encapsulant, wherein the UBM patterns are connected to the TIVs and the TSVs; and
   conductive terminals disposed on the UBM patterns.

7. The package structure according to claim 6, wherein at least one of the TSVs and at least one of the TIVs are connected to a same UBM pattern.

8. The package structure according to claim 6, wherein multiple TSVs are connected to a same UBM pattern.

9. A package, comprising:
   a first die, comprising:
      a first semiconductor substrate;
      first connectors over the first semiconductor substrate; and
      a first dielectric layer encapsulating the first connectors;
   a second die bonded to the first die, comprising:
      a second semiconductor substrate;
      second connectors over the second semiconductor substrate, wherein the second connectors are directly in contact with the first connectors; and
      a second dielectric layer encapsulating the second connectors, wherein the second dielectric layer is directly in contact with the first dielectric layer, and sidewalls of the second dielectric layer are aligned with sidewalls of the second semiconductor substrate; and
   an encapsulant laterally encapsulating the second die, wherein the encapsulant covers a portion of a top surface of the first dielectric layer and the sidewalls of the second dielectric layer.

10. The package according to claim 9, wherein the first die further comprises:
    a first interconnection structure sandwiched between the first dielectric layer and the first semiconductor substrate; and
    auxiliary connectors embedded in the first dielectric layer, wherein the auxiliary connectors are electrically connected to the first interconnection structure.

11. The package according to claim 10, further comprising through insulating vias (TIV) penetrating through the encapsulant, wherein the TIVs are directly in contact with the auxiliary connectors.

12. The package according to claim 11, wherein multiple auxiliary connectors are directly in contact with a same TIV.

13. The package according to claim 11, wherein the second die further comprises:
    a second interconnection structure sandwiched between the second dielectric layer and the second semiconductor substrate; and
    through semiconductor vias (TSV) penetrating through the second semiconductor substrate.

14. The package structure according to claim 13, wherein each TSV is partially wrapped around by the encapsulant.

15. The package structure according to claim 13, further comprising:
    under-ball metallurgy (UBM) patterns disposed on the encapsulant, wherein the UBM patterns are connected to the TIVs and the TSVs; and
    conductive terminals disposed on the UBM patterns.

16. The package structure according to claim 15, wherein multiple TSVs are connected to a same UBM pattern.

17. A manufacturing method of a package, comprising:
    providing a semiconductor wafer having a first bonding structure formed thereon, wherein the first bonding structure comprises a first dielectric layer and first connectors embedded in the first dielectric layer;
    bonding semiconductor dies to the semiconductor wafer, wherein each semiconductor die of the semiconductor dies has a semiconductor substrate, a second bonding structure formed on the semiconductor substrate, and through semiconductor vias (TSV) embedded in the semiconductor substrate, the second bonding structure comprises a second dielectric layer and second connectors embedded in the second dielectric layer, the first bonding structure is in physical contact with the second bonding structure such that the first dielectric layer and the first connectors of the first bonding structure are respectively bonded to the second dielectric layer and the second connectors of the second bonding structure, and sidewalls of the second dielectric layer are aligned with sidewalls of the semiconductor substrate;

forming through insulating vias (TIV) aside the semiconductor dies and connected to the first bonding structure;

laterally encapsulating the semiconductor dies and the TIVs by a first encapsulant; and forming under-ball metallurgy (UBM) patterns and conductive terminals over the first encapsulant and the semiconductor dies, wherein the UBM patterns are connected to the TIVs and the TSVs.

18. The method according to claim 17, further comprising:

after encapsulating the semiconductor dies and the TIVs by the first encapsulant, removing a portion of each semiconductor die to form recesses; and filling a second encapsulant into the recesses such that a top surface of the second encapsulant is substantially coplanar with a top surface of the first encapsulant.

19. The method according to claim 18, wherein the portion of each semiconductor die is removed such that at least a portion of each TSV is protruded from the semiconductor dies.

20. The method according to claim 17, wherein the encapsulating the semiconductor dies and the TIVs comprises:

forming a first encapsulant material over the semiconductor wafer to encapsulate the semiconductor dies and the TIVs; and thinning the first encapsulant material and the semiconductor die until the TIVs and the TSVs are exposed.

\* \* \* \* \*